United States Patent
Zhu et al.

(10) Patent No.: US 12,467,144 B2
(45) Date of Patent: Nov. 11, 2025

(54) METHODS OF CORRELATING ZONES OF PROCESSING CHAMBERS, AND RELATED SYSTEMS AND METHODS

(71) Applicant: Applied Materials, Inc., Santa Clara, CA (US)

(72) Inventors: Zuoming Zhu, Sunnyvale, CA (US); Ala Moradian, Sunnyvale, CA (US); Shu-Kwan Lau, Sunnyvale, CA (US); Manjunath Subbanna, Bangalore (IN); Errol Antonio C. Sanchez, Tracy, CA (US); Abhishek Dube, Fremont, CA (US); Erika R. Warrick, San Jose, CA (US); Martin Jeffrey Salinas, San Jose, CA (US); Chandra Mohapatra, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 464 days.

(21) Appl. No.: 18/085,402

(22) Filed: Dec. 20, 2022

(65) Prior Publication Data

US 2024/0141498 A1    May 2, 2024

(30) Foreign Application Priority Data

Oct. 27, 2022 (IN) .............................. 202241061139

(51) Int. Cl.
  *C23C 16/52* (2006.01)
  *C23C 16/448* (2006.01)
  *C23C 16/455* (2006.01)

(52) U.S. Cl.
  CPC .......... *C23C 16/52* (2013.01); *C23C 16/4481* (2013.01); *C23C 16/45561* (2013.01)

(58) Field of Classification Search
  None
  See application file for complete search history.

(56) References Cited

U.S. PATENT DOCUMENTS

| 5,595,606 A * | 1/1997 | Fujikawa .......... C23C 16/45572 |
| | | 118/724 |
| 6,277,199 B1 * | 8/2001 | Lei .................... H01L 21/67161 |
| | | 118/698 |

(Continued)

FOREIGN PATENT DOCUMENTS

| CN | 111725114 A | 9/2020 |
| CN | 113990780 A | 1/2022 |

(Continued)

OTHER PUBLICATIONS

International Search Report and Written Opinion dated May 12, 2023 for Application No. PCT/US2023/010921.

(Continued)

*Primary Examiner* — Jethro M. Pence
(74) *Attorney, Agent, or Firm* — Patterson + Sheridan, LLP

(57) ABSTRACT

The present disclosure relates to methods of correlating zones of processing chambers, and related systems and methods. In one implementation, a method of correlating zones of a processing chamber includes partitioning the processing volume into a plurality of zones along a first direction of the processing volume and a second direction of the processing volume. The second direction intersects the first direction. The plurality of zones have a first zone number (m), and a second zone number (n). The method includes determining a group number. The determining of the group number includes multiplying a first value by a second value. The first value correlates to a first zone number (m) of a plurality of zones and the second value correlates to a second zone number (n) of the plurality of (Continued)

zones. The method includes grouping the zones into groups having a number that is equal to the group number.

13 Claims, 8 Drawing Sheets

(56) References Cited

U.S. PATENT DOCUMENTS

| | | | |
|---|---|---|---|
| 6,913,652 B2 * | 7/2005 | Shan | C23C 16/45561 156/345.31 |
| 8,003,547 B2 * | 8/2011 | Sakai | C23C 16/52 438/782 |
| 8,361,892 B2 * | 1/2013 | Tam | C23C 16/45519 438/503 |
| 8,673,081 B2 | 3/2014 | Sivaramakrishnan et al. | |
| 8,673,785 B2 * | 3/2014 | Huang | C23C 16/45561 216/37 |
| 9,273,394 B2 * | 3/2016 | Nagatani | G05D 7/0658 |
| 9,620,395 B2 | 4/2017 | Yang et al. | |
| 9,640,416 B2 | 5/2017 | Arai | |
| 9,871,350 B2 | 1/2018 | McLaurin et al. | |
| 9,875,895 B2 | 1/2018 | Yang et al. | |
| 10,161,036 B2 | 12/2018 | Hyon et al. | |
| 10,392,702 B2 | 8/2019 | Jung et al. | |
| 10,741,396 B2 | 8/2020 | Jung et al. | |
| 10,755,955 B2 | 8/2020 | Ishii et al. | |
| 10,903,625 B2 | 1/2021 | McLaurin et al. | |
| 11,111,580 B2 | 9/2021 | Kang et al. | |
| 2002/0005400 A1 | 1/2002 | Gat | |
| 2003/0049372 A1 | 3/2003 | Cook et al. | |
| 2009/0165713 A1 | 7/2009 | Kim et al. | |
| 2011/0108128 A1 * | 5/2011 | Kishimoto | C23C 16/45561 137/12 |
| 2011/0271753 A1 * | 11/2011 | Sakai | C23C 16/4485 73/196 |
| 2015/0275367 A1 * | 10/2015 | Moroi | C23C 16/4481 427/255.28 |
| 2018/0315626 A1 | 11/2018 | Franklin | |
| 2019/0309419 A1 | 10/2019 | Baluja | |
| 2021/0028075 A1 | 1/2021 | Zhu et al. | |
| 2021/0324514 A1 | 10/2021 | Ye et al. | |
| 2022/0090263 A1 * | 3/2022 | Yahata | C23C 16/401 |
| 2022/0121196 A1 | 4/2022 | Omori | |
| 2022/0162751 A1 | 5/2022 | Haanstra et al. | |
| 2022/0170156 A1 | 6/2022 | Jdira et al. | |
| 2022/0181193 A1 | 6/2022 | Gao et al. | |
| 2022/0189804 A1 | 6/2022 | Luan et al. | |
| 2022/0199444 A1 | 6/2022 | Oosterlaken et al. | |
| 2022/0254668 A1 | 8/2022 | Oosterlaken et al. | |
| 2022/0268520 A1 | 8/2022 | Oosterlaken et al. | |
| 2022/0298636 A1 * | 9/2022 | Asrani | C23C 16/458 |
| 2022/0298643 A1 | 9/2022 | Kajbafvala et al. | |
| 2022/0298672 A1 | 9/2022 | M'Saad et al. | |
| 2022/0301829 A1 | 9/2022 | Yoshikawa | |
| 2022/0301867 A1 * | 9/2022 | Tannos | H01J 37/32724 |
| 2022/0301905 A1 | 9/2022 | Ye et al. | |
| 2022/0301906 A1 | 9/2022 | Naik et al. | |
| 2022/0352006 A1 | 11/2022 | Huang et al. | |
| 2022/0359246 A1 | 11/2022 | Umeoka | |
| 2024/0018658 A1 * | 1/2024 | Zhu | C30B 25/14 |

FOREIGN PATENT DOCUMENTS

| | | |
|---|---|---|
| CN | 111893567 B | 2/2022 |
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 216357351 U | 4/2022 |
| CN | 110854044 B | 5/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| JP | 2003168650 A | 6/2003 |
| JP | 2010056472 A | 3/2010 |
| KR | 101224521 B1 | 1/2013 |
| KR | 20130074413 A | 7/2013 |
| KR | 102344450 B1 | 12/2021 |
| WO | 2022031406 A1 | 2/2022 |

OTHER PUBLICATIONS

International Search Report and Written Opinion dated Nov. 7, 2023 for Application No. PCT/US2023/027668.

* cited by examiner

METHODS OF CORRELATING ZONES OF PROCESSING CHAMBERS, AND RELATED SYSTEMS AND METHODS

CROSS-REFERENCE TO RELATED APPLICATION

This application claims priority to India provisional patent application serial number 202241061139, filed Oct. 27, 2022, which is herein incorporated by reference in its entirety.

BACKGROUND

Field

The present disclosure relates to methods of correlating zones (such as flow zones and/or heating zones) of processing chambers, and related systems and methods, for deposition uniformity and process adjustability.

Description of the Related Art

Semiconductor substrates are processed for a wide variety of applications, including the fabrication of integrated devices and microdevices. However, operations (such as epitaxial deposition operations) can be long, expensive, and inefficient, and can have limited capacity and throughput. Operations can also be limited with respect to film growth rates. Moreover, hardware can involve relatively large dimensions that occupy higher footprints in manufacturing facilities. Additionally, operations can involve hindrances with temperature control, gas control, and/or substrate center-to-edge control and adjustability. Such hindrances can be exacerbated in relatively complex processing operations. For example, deposition non-uniformity and process adjustability can be hindered in batch epitaxial processing.

Therefore, a need exists for improved apparatuses and methods in semiconductor processing.

SUMMARY

The present disclosure relates to methods of correlating zones of processing chambers, and related systems and methods, for deposition uniformity and process adjustability.

In one implementation, a method of correlating zones of a processing chamber includes partitioning the processing volume into a plurality of zones along a first direction of the processing volume and a second direction of the processing volume. The second direction intersects the first direction. The plurality of zones have a first zone number (m), and a second zone number (n). The method includes determining a group number, and the determining of the group number includes determining a first value and a second value. The first value correlates to a first zone number (m) of a plurality of zones and the second value correlates to a second zone number (n) of the plurality of zones. The determining of the group number includes multiplying the first value by the second value. The method includes grouping the plurality of zones into a plurality of groups, the plurality of groups having a number that is equal to the group number. The method includes connecting one or more gas lines to each respective group of the plurality of groups such that the same one or more gas lines connect a subset of the plurality of zones grouped into the respective group.

In one implementation, an apparatus for processing substrates, includes a processing chamber having a processing volume that includes a plurality of zones, and one or more substrate supports disposed in the processing volume. The apparatus includes a plurality of gas openings formed in one or more sidewalls of the processing chamber, and a flow guide structure disposed in the processing volume. The flow guide structure divides the processing volume into a plurality of zones. The apparatus includes a first main line fluidly connected to a first group of the plurality of zones such that the first main line is fluidly connected to a first subset of the plurality of zones grouped into the first group. The apparatus includes a second main line fluidly connected to a second group of the plurality of zones such that the second main line is fluidly connected to a second subset of the plurality of zones grouped into the second group.

In one implementation, a system for processing substrates includes a processing chamber having a processing volume that includes a plurality of zones, one or more substrate supports disposed in the processing volume, and a plurality of gas openings formed in one or more sidewalls of the processing chamber. The system includes a first main line fluidly connected to a first subset of the plurality of gas openings. The first subset is aligned with a first group of the plurality of zones. The system includes a second main line fluidly connected to a second subset of the plurality of gas openings. The second subset is aligned with a second group of the plurality of zones. The system includes one or more flow ratio controllers (FRCs) configured to supply one or more reactive gases to the first main line and the second main line, a first mass flow controller (MFC) configured to supply a first carrier gas to the first main line, and a second MFC configured to supply a second carrier gas to the second main line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods of correlating zones of processing chambers, and related systems and methods, for deposition uniformity and process adjustability.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links.

Figure 1:
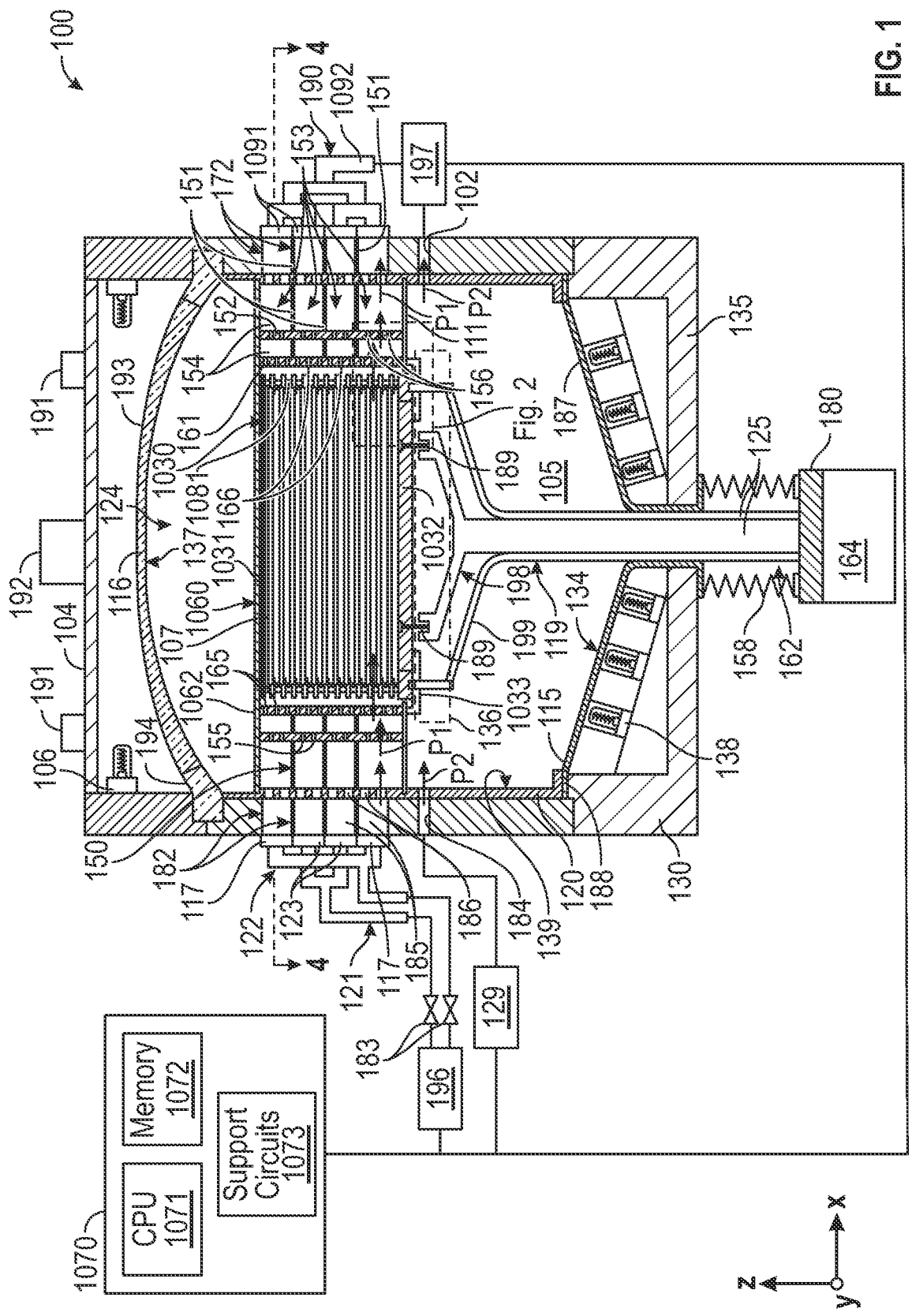
FIG. 1 is a schematic cross-sectional side view of a processing apparatus, along Section 1-1 shown in FIG. 4, according to one implementation.
Figure 3:
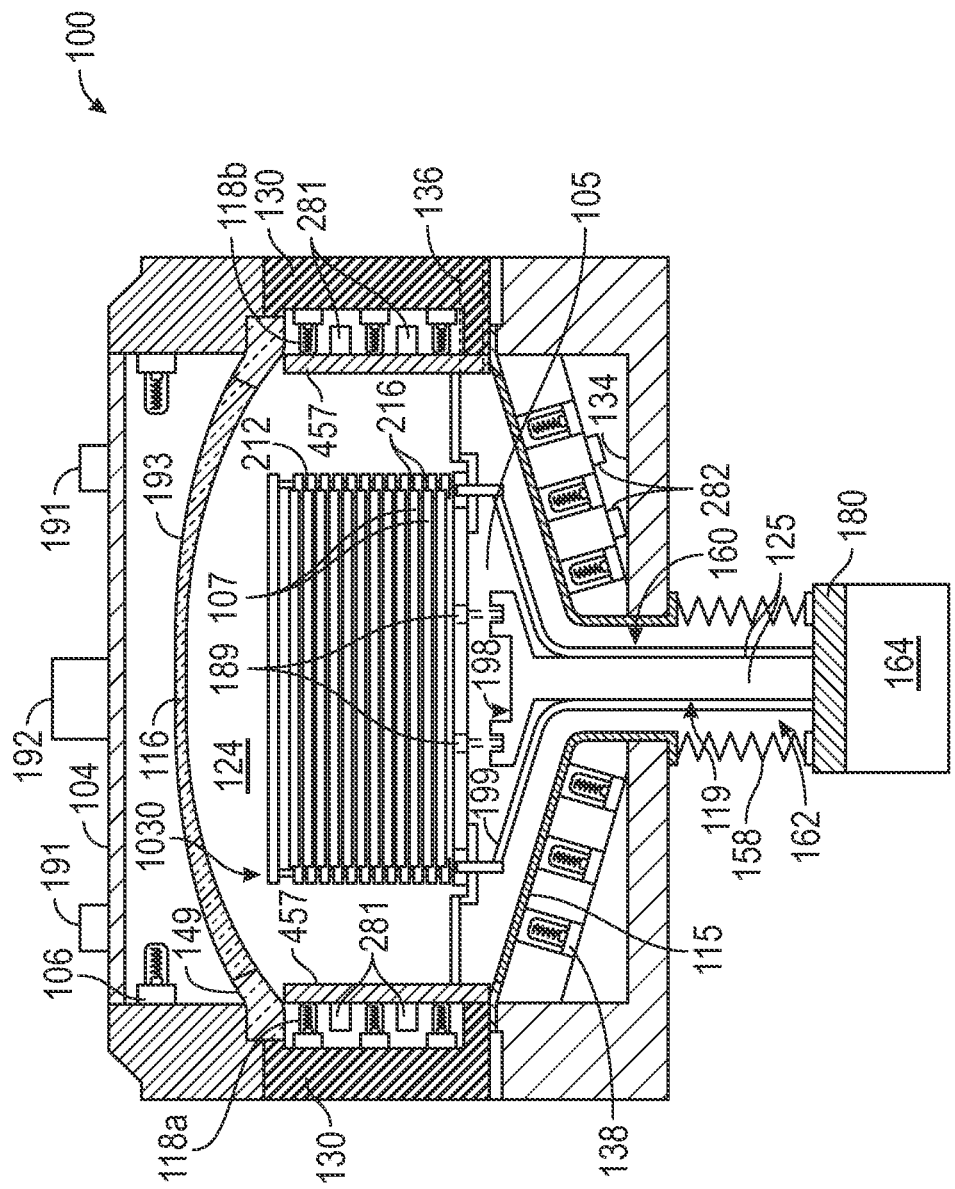
FIG. 3 is a schematic cross-sectional side view of the processing apparatus shown in FIG. 1, along Section 3-3 shown in FIG. 4, according to one implementation.
Figure 4:
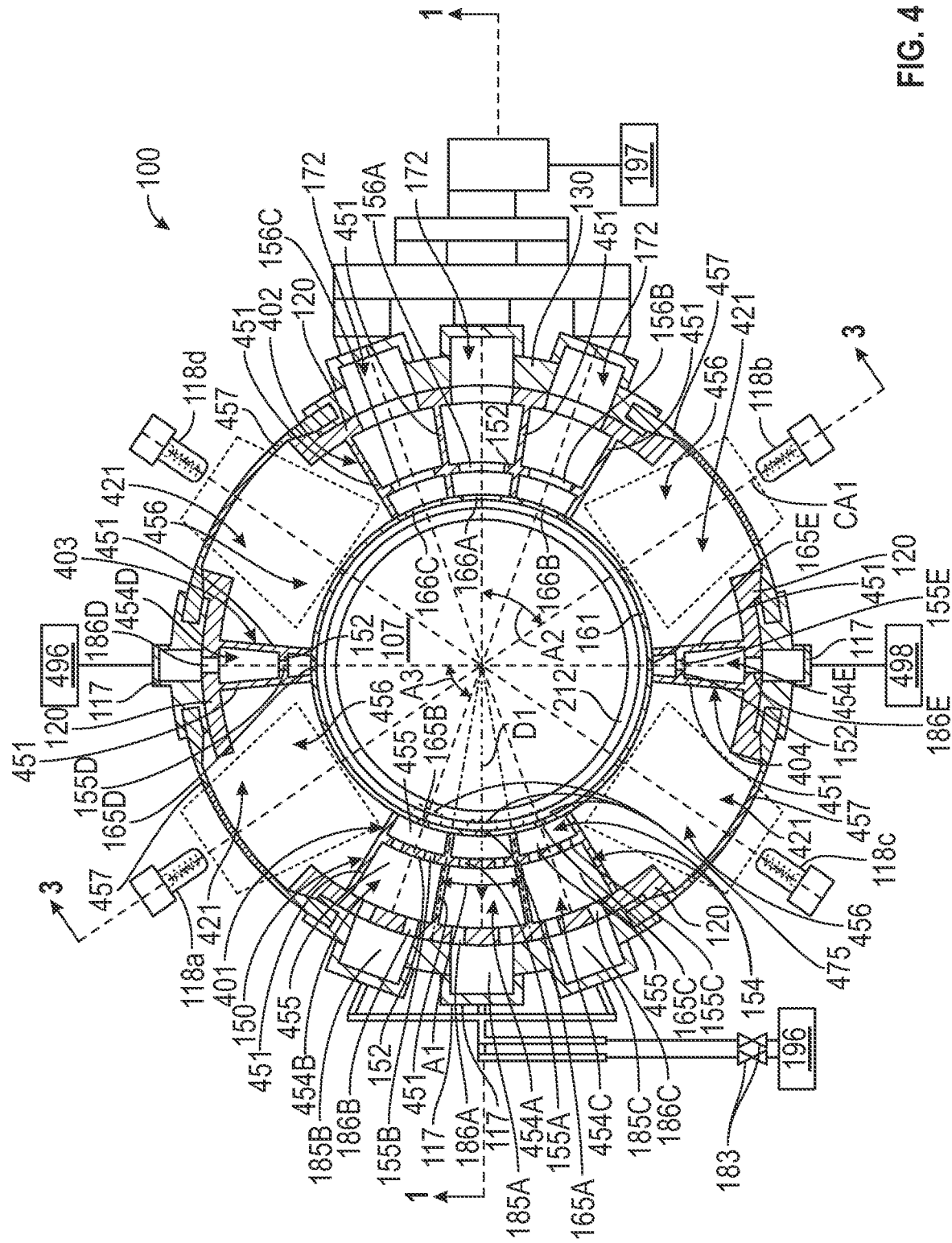
FIG. 4 is a schematic top cross-sectional view, along Section 4-4 shown in FIG. 1, of the processing apparatus shown in FIGS. 1-3, according to one implementation.

FIG. 1 is a schematic cross-sectional side view of a processing apparatus 100, along Section 1-1 shown in FIG. 4, according to one implementation. The side heat sources 118a, 118b shown in FIG. 3 are not shown in FIG. 1 for visual clarity purposes. The processing apparatus 100 includes a processing chamber having a chamber body 130 that defines a processing volume 124.

A cassette 1030 is positioned in the processing volume 124 and at least partially supported by a substrate support assembly 119 (such as a pedestal assembly). The cassette 1030 is positioned inwardly of a first shield plate 161. The cassette 1030 includes a first cassette plate 1032, a second cassette plate 1031 spaced from the first cassette plate 1032, and a plurality of levels that support a plurality of substrates 107 for simultaneous processing (e.g., epitaxial deposition). In the implementation shown in FIG. 1, the cassette 1030 supports twelve substrates 107. The cassette 1030 can support other numbers of substrates, including but not limited to two substrates 107, three substrates 107, six substrates 107, or eight substrates 107.

The processing apparatus 100 includes an upper window 116, such as a dome, disposed between a lid 104 and the processing volume 124. The processing apparatus 100 includes a lower window 115 disposed below the processing volume 124. One or more upper heat sources 106 are positioned above the processing volume 124 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 107. One or more lower heat sources 138 are positioned below the processing volume 124 and the lower window 115. The one or more lower heat sources 138 can be radiant heat sources such as lamps, for example halogen lamps. The lower heat sources 138 are disposed between the lower window 115 and a floor 134 of the processing volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 95% of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window that partially defines the processing volume 124. The outer window supports 194 support the inner window 193 and are at least partially disposed within a support groove. In one or more embodiments, the lower window 115 includes an inner window 187 and outer window supports 188. The inner window 187 may be a thin quartz window that partially defines the processing volume 124. The outer window supports 188 support the inner window 187.

The substrate support assembly 119 is disposed in the processing volume 124. One or more liners 120 are disposed in the processing volume 124 and surround the substrate support assembly 119. The one or more liners 120 facilitate shielding the chamber body 130 from processing chemistry in the processing volume 124. The chamber body 130 is disposed at least partially between the upper window 116 and the lower window 115. The one or more liners 120 are disposed between the processing volume 124 and the chamber body 130.

The processing apparatus 100 includes a plurality of gas inject passages 182 formed in the chamber body 130 and in fluid communication with the processing volume 124, and one or more gas exhaust passages 172 (a plurality is shown in FIG. 1) formed in the chamber body 130 opposite the plurality of gas inject passages 182. The one or more gas exhaust passages 172 are in fluid communication with the processing volume 124. Each of the plurality of gas inject passages 182 and one or more gas exhaust passages 172 are formed through one or more sidewalls of the chamber body 130 and through one or more liners 120 that line the one or more sidewalls of the chamber body 130.

Each gas inject passage 182 includes a gas channel 185 formed in the chamber body 130 and one or more gas openings 186 (two and three are shown in FIG. 1) formed in the one or more liners 120. One or more supply conduit systems are in fluid communication with the gas inject passages 182. In FIG. 1, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing apparatus 100 includes a flow guide structure 150 positioned in the processing volume 124. The flow guide structure 150 includes one or more first flow dividers 151 (three are shown in FIG. 1) that divide the processing volume into a plurality of flow levels 153 (four flow levels are shown in FIG. 1). In one or more embodiments, the flow guide structure 150 includes at least three flow levels 153. The flow guide structure 150 includes one or more second flow dividers 152 oriented to intersect the one or more first flow dividers 151 and divide each flow level 153 of the plurality of flow levels 153 into a plurality of flow sections 154 (two flow sections 154 are shown for each flow level 153 in FIG. 1). In the implementation shown in FIG. 1, the first flow dividers 151 each include a ring, and the one or more second flow dividers 152 each include a cylindrical sleeve that surrounds an innermost flow section 154 of the flow sections 154. The one or more first flow dividers 151 are coupled to the one or more liners 120.

The plurality of gas inject passages are 182 positioned as a plurality of inject levels such that each gas inject passage 182 corresponds to one of the plurality of inject levels. Each inject level aligns with a respective flow level 153. The gas inject passages 182 of each inject level are open to an outermost flow section 154 of the respective flow level (through the gas openings 186). In the implementation shown in FIG. 1, two or three of the gas openings 186 (e.g., inlet openings) are grouped into each flow level, and the gas openings 186 are open to the outermost flow section 154 of the respective flow level.

The processing apparatus 100 includes a heat shield structure 1060 positioned in the processing volume 124. The heat shield structure 1060 includes the first shield plate 161 positioned inwardly of the one or more second flow dividers 152, and a second shield plate 1062. The second shield plate 1062 is oriented to intersect the first shield plate 161 and is supported at least partially by the one or more liners 120. The first shield plate 161 can be a cylindrical sleeve.

Each of the one or more second flow dividers 152 includes a plurality of divider inlet openings 155 and a plurality of divider outlet openings 156 formed therein. The divider outlet openings 156 are opposite of the divider inlet openings 155. As shown in FIG. 1, two or three of the divider inlet openings 155 and two or three of the divider outlet openings 156 are grouped into a respective flow level 153 of the flow levels 153.

The first shield plate 161 includes a plurality of shield inlet openings 165 and a plurality of shield outlet openings 166 formed therein. The shield outlet openings 166 are opposite of the shield inlet openings 165. The plurality of divider inlet openings 155 are offset from the plurality of shield inlet openings 165 in the X-Y plane.

Each of the one or more liners 120, the one or more first flow dividers 151, the one or more second flow dividers 152, the one or more third flow dividers 451, the first shield plate 161, and the second shield plate 1062 is formed of one or more of quartz (such as transparent quartz, e.g. clear quartz, or opaque quartz, e.g. black quartz), silicon carbide (SiC), or graphite coated with SiC.

The cassette 1030 is positioned inwardly of the first shield plate 161. A pre-heat ring 111 is positioned outwardly of the cassette 1030. The pre-heat ring 111 is coupled to and/or at least partially supported by the one or more liners 120. The one or more second flow dividers 152 are coupled to and/or at least partially supported by the pre-heat ring 111.

Portions of the flow guide structure 150 (such as the first flow dividers 151) may act as a pre-heat ring for all flow sections 154 of each flow level 153. The pre-heat ring 111 may be part of (such as integrated with) the flow guide structure 150. The present disclosure contemplates that the pre-heat ring 111 can be one of the first flow dividers 151.

During operations (such as during an epitaxial deposition operation), one or more process gases P1 are supplied to the processing volume 124 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passage 182 is configured to direct the one or more processing gases P1 in a generally radially inward direction towards the cassette 1030. As such, in one or more embodiments, the gas inject passages 182 may be part of a cross-flow gas injector. The flow(s) of the one or more process gases P1 are divided into the plurality of flow levels 153. The division of process gas(es) into the plurality of flow levels 153 facilitates uniform processing (e.g., deposition) onto the substrates, center-to-edge uniformity, and process adjustability.

The processing apparatus 100 includes an exhaust conduit system 190. The one or more process gases P1 can be exhausted through exhaust gas openings formed in the one or more liners 120, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$))), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases can include, for example, one or more of argon (Ar), helium (He), nitrogen ($N_2$), hydrogen chloride (HCl), and/or hydrogen ($H_2$).

Purge gas P2 supplied from a purge gas source 129 is introduced to the bottom region 105 of the processing volume 124 through one or more purge gas inlets 184 formed in the sidewall of the chamber body 130.

The one or more purge gas inlets 184 are disposed at an elevation below the gas inject passages 182. If the one or more liners 120 are used, a section of the one or more liners 120 may be disposed between the gas inject passages 182 and the one or more purge gas inlets 184. In either case, the one or more purge gas inlets 184 are configured to direct the purge gas P2 in a generally radially inward direction. The one or more purge gas inlets 184 may be configured to direct the purge gas P2 in an upward direction. During a film formation process, the substrate support assembly 119 is located at a position that can facilitate the purge gas P2 to flow generally along a flow path across a back side of the cassette 1030. The purge gas P2 exits the bottom region 105 and is exhausted out of the processing apparatus 100 through one or more purge gas exhaust passages 102 located on the opposite side of the processing volume 124 relative to the one or more purge gas inlets 184.

The substrate support assembly 119 includes a first support frame 198 and a second support frame 199 disposed at least partially about the first support frame 198. The second support frame 199 includes arms coupled to the cassette 1030 such that lifting and lowering the second support frame 199 lifts and lowers the cassette 1030. A plurality of lift pins 189 are suspended from the cassette 1030. Lowering of the cassette 1030 initiates contact of the lift pins 189 with arms of the first support frame 198. Continued lowering of the cassette 1030 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030. A stem 125 of each support frame 198, 199 extends through a bottom 135 of the chamber body 130 and the floor 134. The stems 125 are coupled to a respective motor 164, which is configured to independently raise, lower, and/or rotate the cassette 1030 using the second support frame 199, and to independently raise and lower the lift pins 189 using the first support frame 198.

A pedestal bellows port 160 is formed in the floor 134 and the bottom 135 of the chamber body 130. The pedestal bellows ports 160 extends through the bottom 135 of the chamber body 130. The pedestal bellows port 160 has a diameter larger than a diameter of the stem 125 and circumscribes each stem 125 where the stem 125 extends through the bottom 135 of the chamber body 130. The pedestal bellows port 160 circumferentially surround the stems 125. A bellows assembly 158 is disposed around each pedestal bellows port 160 to facilitate reduced or eliminated vacuum leakage outside the chamber body 130. Each of the bellows assemblies 158 circumscribe and enclose a portion of the stems 125 disposed outside the chamber body 130. The bellows assemblies 158 are coupled between an exterior surface of the bottom 135 of the chamber body 130 and a base member 180. The base member 180 may house the motor 164 and a portion of the stem 125, which is coupled to the motor 164. The bellows assembly 158 may be formed from a metallic or metallized material and be configured to form a gas flow channel 162. The gas flow channel 162 is defined as a region between the outer stem 125 and the bellows assembly 158. The gas flow channel 162 extends from the pedestal bellows port 160 to the base member 180. As such, the gas flow channel 162 forms a hollow cylindrically shaped passage between the bellows assembly 158 and the stem 125. The gas flow channel 162 is fluidly coupled between the bottom region 105 and an exhaust conduit, which may be used to pump (e.g., exhaust) gases from the bottom region 105 through the pedestal bellows port 160.

An opening 136 (a substrate transfer opening) is formed through the one or more sidewalls of the chamber body 130. The opening 136 may be used to transfer the substrates 107 to or from the cassette 1030, e.g., in and out of the processing volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 3 for visual clarity purposes.

The processing apparatus 100 may include one or more temperature sensors 191, 192, 282, such as optical pyrometers, which measure temperatures within the processing apparatus 100 (such as on the surfaces of the upper window 116, and/or one or more surfaces of the substrates 107, the heat shield structure 1060, and/or the cassette 1030). The one or more temperature sensors 191, 192 are disposed on the lid 104. The one or more temperature sensors 282 (e.g., lower pyrometers) are disposed on a lower side of the lower window 115. The one or more temperature sensors 282 can be disposed adjacent to and/or on the bottom 135 of the chamber body 130.

In one or more embodiments, upper temperature sensors 191, 192 are oriented toward a top of the cassette 1030 (such as an upper surface of the second cassette plate 1031. In one or more embodiments, side temperature sensors 281 are oriented toward the first shield plate 161 and/or substrate supports 212 of the cassette 1030. In one or more embodiments, lower temperature sensors 282 are oriented toward a bottom of the cassette 1030 (such as a lower surface of the first cassette plate 1032.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 500) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 500) and operations (such as the operations 502-518) described herein to be conducted. The controller 1070 can be in communication with the heat sources, the gas sources, and/or the vacuum pump(s) of the processing apparatus 100, for example, to cause a plurality of operations to be conducted.

The instructions stored in the memory 1072 of the controller 1070 can include one or more machine learning/artificial intelligence algorithms that can be executed in addition to the operations described herein. For example, the one or more machine learning/artificial intelligence algorithms can use measured data (such as flow rate data and/or temperature data) to optimize the gas conditions discussed herein. For example, pyrometers and/or flow rate sensors 475 mounted to the first shield plate 161 and/or the second shield plate 1062 can measure the flow rate data and the temperature data. The one or more machine learning/artificial intelligence algorithms can use, for example, a linear regression model and/or a ranked model to adjust and optimize the gas conditions for the groups of zones discussed herein.

The one or more machine learning/artificial intelligence algorithms can be used to automatically detect and adjust for asymmetr(ies).

The various operations described herein (such as the operations 502-518 of the method 500) can be conducted automatically using the controller 1070, can be conducted manually by a user, or can be conducted automatically and manually with certain operations conducted by a user.

Figure 2:
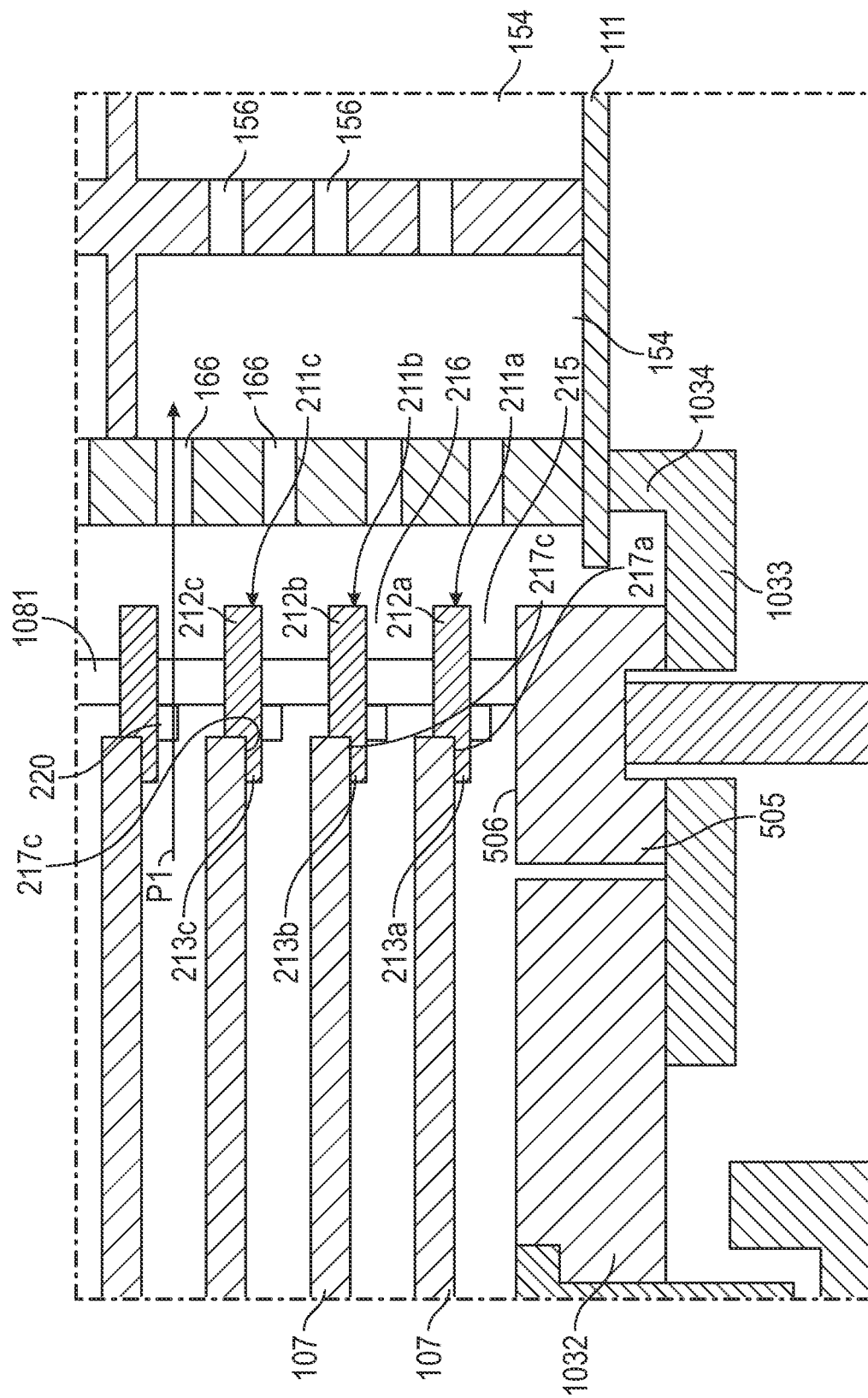
FIG. 2 is an enlarged view of the schematic cross-sectional side view of the processing apparatus shown in FIG. 1, according to one implementation.

FIG. 2 is an enlarged view of the schematic cross-sectional side view of the processing apparatus 100 shown in FIG. 1, according to one implementation.

The cassette 1030 includes a plurality of levels 211 positioned between the first cassette plate 1032 and the second cassette plate 1031.

Each level 211 includes an arcuate support 212 having one or more inner ledges 213 that support a substrate 107. A section of the cassette 1030 is shown in FIG. 2. The cassette 1030 includes a first level 211a that includes a first arcuate support 212a having a first inner ledge 213a, and a second level 211b that includes a second arcuate support 212b having a second inner ledge 213b. The first arcuate support 212a and the second arcuate support 212b are positioned between the first cassette plate 1032 and the second cassette plate 1031.

The cassette 1030 includes a first opening 215 on an outer side of the first arcuate support 212a, a second opening 216 between the first arcuate support 212a and the second arcuate support 212b. Each inner ledge 213a-213c includes a support surface 217a-217c.

Each of the shield inlet openings 165 and each of the shield outlet openings 166 is aligned between two respective arcuate supports 212 (as shown for the shield outlet openings 166 in FIG. 2). The positions of the shield inlet openings 165 and the shield outlet openings 166 facilitate separately providing the one or more process gases P1 to gaps between adjacent substrates 107, which facilitates processing uniformity and processing adjustability.

The cassette 1030 includes a plurality of mount columns 1081 extending through the arcuate supports 212 (including the first arcuate support 212a, the second arcuate support 212b, and a third arcuate support 212c).

Each mount column 1081 of the plurality of mount columns 1081 includes ledge interfaces between the respective mount column and the arcuate supports 212. In one or more embodiments, ledges 220 can extend outwardly relative to the mount columns 1081. In one or more embodiments, ledges can extend inwardly relative to inner faces of the arcuate supports 212, such as into grooves formed in outer faces of the mount columns 1081. The ledges 220 can include, for example, one or more pins or one or more arcuate ring segments.

The substrate support assembly 119 includes an outer ring 1033 supporting the first cassette plate 1032.

Each of the arcuate supports 212 of the levels 211 is a ring or one or more ring segments. Each arcuate support 212 can include a gap 501 such that each arcuate support 212 is a single C-ring segment. The cassette 1030 includes a base segment 505, and arms of the second support frame 199 can be coupled to the base segment 505 through the first cassette plate 1032. The first cassette plate 1032 and the outer ring 1033 can be two pieces (as shown in FIG. 2) or can be integrated into a single piece. In one or more embodiments, the mount columns 1081 extend at least partially through the second cassette plate 1031 at a first end and extend at least partially through the base segment 505 at a second end. The mount columns 1081 can be attached to or integrally formed with the base segment 505. In one or more embodiments, the mount columns 1081 are attached to or integrally formed with an upper surface 506 of the base segment 505.

FIG. 3 is a schematic cross-sectional side view of the processing apparatus 100 shown in FIG. 1, along Section 3-3 shown in FIG. 4, according to one implementation. The cross-sectional view shown in FIG. 3 is rotated by 55 degrees relative to the cross-sectional view shown in FIG. 1.

The processing apparatus 100 includes one or more side heat sources 118a, 118b (e.g., side lamps, side resistive heaters, side LEDs, and/or side lasers, for example) positioned outwardly of the processing volume 124. One or more second side heat sources 118b are opposite one or more first side heat sources 118a across the processing volume 124.

In FIG. 3, the flow guide structure 150 and the heat shield structure 1060 are not shown for visual clarity purposes. Additionally, the present disclosure contemplates that the flow guide structure 150 and/or the heat shield structure 1060 can be omitted from the processing apparatus 100 shown in FIGS. 1-3. In such an implementation, the one or more process gases P1 flow into an outer annulus of the processing volume 124 from the gas inject passages 182, and then flow into openings 215, 216 between and outwardly of the arcuate supports 212, and then into gaps between substrates 107. The one or more process gases P1 flow out of the gaps, into the openings 215, 216 on an exhaust side of the substrates 107, into the outer annulus of the processing volume 124, and into the one or more gas exhaust passages 172. The present disclosure also contemplates that a plurality of lines (such as conduits) in the processing volume 124 can connect each of the gas inject passages 182 to each of the inlet openings of the cassette 1030.

In addition to the one or more temperature sensors 191, 192 positioned above the processing volume 124 and above the second shield plate 1062, the processing apparatus 100 may include one or more temperature sensors 281, such as optical pyrometers, which measure temperatures within the processing apparatus 100 (such as on the surfaces of the upper window 116 and/or one or more surfaces of the substrates 107, the heat shield structure 1060, the plurality of windows 457 (discussed below), and/or the cassette 1030). The one or more temperature sensors 281 are side temperature sensors (e.g., side pyrometers) that are positioned outwardly of the processing volume 124, outwardly of the one or more second flow dividers 152 of the flow guide structure 150, outwardly of the one or more second flow dividers 152 of the flow guide structure 150, and outwardly of the plurality of windows 457. The one or more temperature sensors 281 can be radially aligned, for example, with the second flow dividers 152 or the plurality of windows 457 (as shown in FIG. 3).

The one or more side temperature sensors 281 (such as one or more pyrometers) can be used to measure temperatures within the processing volume 124 from respective sides of the processing volume 124. The side sensors 281 are arranged in a plurality of sensor levels (three sensor levels are shown in FIG. 3). In one or more embodiments, the number of sensor levels is equal to the number of levels of the cassette 1030. Each sensor level corresponds to a respective level of the cassette 1030 such that one or more side sensors of each sensor level is configured to measure a temperature of the respective level (e.g., a temperature of the substrate and/or the substrate support of the respective level). Each side sensor 281 can be oriented horizontally or can be directed (e.g., oriented downwardly at an angle) toward the substrate 107 and arcuate support 212 of a respective level of the cassette 1030.

FIG. 4 is a schematic top cross-sectional view, along Section 4-4 shown in FIG. 1, of the processing apparatus 100 shown in FIGS. 1-3, according to one implementation.

The flow guide structure 150 includes one or more third flow dividers 451 oriented to intersect the one or more first flow dividers 151 and the one or more second flow dividers 152. The one or more third flow dividers 451 divide the plurality of flow sections 154 into a plurality of flow zones 454 (three flow zones 454 are shown for the injection section 401 in FIG. 4). In one or more embodiments, the flow guide structure 150 includes at least two flow zones 454 for the injection section 401. Each flow zone 454 of the plurality of flow zones 454 has an angular size A1 that is within a range of 15 degrees to 25 degrees. In one or more embodiments, the angular size A1 is 20 degrees. Other values are contemplated for the angular size A1. Each of the flow zones 454B, 454C includes a central axis that is angularly offset from Section 1-1 by an angle that is equal to the angular size A1.

Each flow section 154 of the plurality of flow sections 154 includes a plurality of inner voids 455 defined by the plurality of flow zones 454 such that the flow guide structure 150 and the heat shield structure 1060 are both free from gas lines. The processing apparatus 100 is free from gas lines inwardly of the gas channels 185 and inwardly of the gas exhaust passages 172. The one or more process gases P1 flow from the gas channels 185, through the one or more gas openings 186, and into the flow sections 154 on an inject side of the cassette 1030. The one or more process gases flow from the flow sections 154, through the shield inlet openings 165, and into an inner space surrounded by the first shield plate 161. Within the inner space, the process gases P1 flow between the arcuate supports 212 and between the substrates 107. The one or more process gases P1 flow out of the inner space, through the first shield plate 161 on an exhaust side of the cassette 1030, and out through the flow sections 154 on the exhaust side of the cassette 1030. In the one or more liners 120, the flow guide structure 150, and the heat shield structure 1060, the one or more process gases P1 flow through openings and voids rather than gas lines (such as pipes and conduits). Injection of the one or more process gases P1 include flowing directly from the shield inlet openings 165 and into the openings between the arcuate supports 212, and directly from the openings between the arcuate supports 212 and into gaps between the substrates 107.

In one or more embodiments, the heat shield structure 1060 is isothermal during processing (e.g., during heating using the heat sources) such that a first temperature gradient along a height of the first shield plate 161 is within a difference of 5% or less along the entirety of the height. The heat shield structure 1060 is isothermal such that a second temperature gradient along a width of the second shield plate 1062 is within a difference of 5% or less along the entirety of the width.

The gas inject passages 182 of each inject level include one or more first gas channels 185A (one is shown) and one or more first gas openings 186A (two are shown) aligned with a first flow zone 454A of the plurality of flow zones 454. The gas inject passages 182 of each inject level include one or more second gas channels 185B (one is shown) and one or more second gas openings 186B aligned with a second flow zone 454B of the plurality of flow zones 454. The second flow zone 454B is on a first side of the first flow zone 454A. The gas inject passages 182 of each inject level include one or more second gas channels 185C (one is shown) and one or more third gas openings 186C aligned with a third flow zone 454C of the plurality of flow zones 454. The third flow zone 454C is on a second side of the first flow zone 454A.

The one or more third flow dividers 451 extend radially outward between the first shield plate 161 and the chamber body 130 such that plurality of flow zones 454 are pie-shaped.

Each of the gas openings 186, the divider inlet openings 155, the divider outlet openings 156, the shield inlet openings 165, and/or the shield outlet openings 166 can include holes (such as cylindrical holes) and/or arcuate slots. For each inject level, each of the gas openings 186, the divider inlet openings 155, the divider outlet openings 156, the shield inlet openings 165, and/or the shield outlet openings 166 can include a single opening or a plurality of openings. For example, the three shield outlet openings 166 shown in FIG. 4 can be combined into a single arcuate slot.

The plurality of divider inlet openings 155 are offset from the plurality of shield inlet openings 165 in a direction D1 parallel to the one or more third flow dividers 451.

The plurality of divider inlet openings 155 include one or more divider inlet openings 155A, 155B, 155C aligned with each respective flow zone 454A, 454B, 454C of the plurality of flow zones 454. The plurality of shield inlet openings 165 include one or more shield inlet openings 165A, 165B, 165C aligned with each respective flow zone 454A, 454B, 454C of the plurality of flow zones 454. The plurality of divider outlet openings 156 include one or more divider outlet openings 156A, 156B, 156C aligned with each respective flow zone 454A, 454B, 454C of the plurality of flow zones 454. The plurality of shield outlet openings 166 include one or more shield outlet openings 166A, 166B, 166C aligned with each respective flow zone 454A, 454B, 454C of the plurality of flow zones 454.

The one or more liners 120 include a plurality of liner gaps 421. The liner gaps 421 can be formed in the one or more liners 120 and/or disposed between liners of the one or more liners 120. The flow guide structure 150 includes a plurality of flow gaps 456 between the plurality of third flow dividers 451. Each of the side heat sources 118a-118d and the windows 457 includes a central axis CA1 that is angularly offset from Section 1-1 by an angle A2. The angle A2 is within a range of 50 degrees to 60 degrees. In one or more embodiments, the angle A2 is 55 degrees. Other values are contemplated for the angle A2. In one or more embodiments, four side heat sources 118a-118d are included for each inject level 153 of the plurality of inject levels 153 such that the number of side heat source levels is equal to the number of inject levels 153 and the number of flow levels. In one or more embodiments the plurality of side heat sources 118a-118d are arranged in a plurality of heat source levels that correspond to the plurality of flow levels and the plurality of inject levels 153, and each of the plurality of heat sources 118a-118d is independently controlled to independently heat each flow level and each inject level 153. For example, a different irradiation can be directed toward each flow level and each inject level 153.

The plurality of flow gaps 456 are aligned with the plurality of liner gaps 421. The flow guide structure 150 includes a plurality of windows 457 aligned at least partially with the plurality of liner gaps 421. A plurality of side heat sources 118a-118d are configured to generate heat (e.g., light) through the plurality of windows 457 and the plurality of flow gaps 456. Using the windows 457 and the flow gaps 456, the heat (e.g., light) is directed toward the first shield plate 161 and not the flow guide structure 150 to facilitate heating the isothermal heat shield structure 1060. The plurality of windows 457 are offset from each other circumferentially along the chamber body 130. In one or more embodiments, the windows 457 are formed of quartz. In one or more embodiments, the windows 457 are substantially transparent and the heat shield structure 1060 and the flow guide structure 150 are each substantially opaque.

As shown in FIG. 1, each of the plurality of divider inlet openings 155, the plurality of divider outlet openings 156, the plurality of shield inlet openings 165, and the plurality of shield outlet openings 166 is aligned between the floor 134 of the processing volume 124 and a ceiling 137 of the processing volume 124. Injection and exhaustion of the process gases P1 and the purge gases P2 into and out of the processing volume 124 are through one or more sides 139 of the processing volume 124 (between the floor 134 and the ceiling 137).

As shown in FIG. 1, the opening 136 is positioned below the flow guide structure 150, below the heat shield structure 1060, and below the pre-heat ring 111. When the substrate support assembly 119 and the cassette 1030 are in a raised position for processing, the cassette 1030 (including the first cassette plate 1032) is positioned above the opening 136. In the raised position, a shoulder 1034 of the outer ring 1033 of the substrate support assembly 119 engages the pre-heat ring 111 to substantially isolate (e.g., seal) the bottom region 105 and the opening 136 from the one or more process gases P1 to facilitate reduced gas escaping through the opening 136, and reduced corrosion and/or contamination of chamber components and/or stored substrates. The substrate support assembly 119 and the cassette 1030 (including the first cassette plate 1032 and the outer ring 1033) facilitate a smaller travel distance (e.g., less lowering) of the cassette 1030 to transfer substrates 107 into or out of the cassette 1030.

As shown in FIG. 4, the flow guide structure 150 includes an injection section 401, an exhaust section 402, a first cross-flow section 403, and a second cross-flow section 404. Each of the sections 401-404 includes the one or more first flow dividers 151 and the one or more second flow dividers 152. The first and second cross-flow sections 403, 404 each include two third flow dividers 451, and the injection and exhaust sections 401, 402 each include four third flow dividers 451. In one or more embodiments, the sections 401-404 each include the same number of inject levels. In the implementation shown in FIG. 4, the gas inject passages 182 of each inject level include one or more first gas openings 186A-186C opposite of the one or more gas exhaust passages 172, one or more second gas openings 186D circumferentially between the one or more first gas openings 186A-186C and the one or more gas exhaust passages 172, and one or more third gas openings 186E opposite of the one or more second gas openings 186D. Each of the one or more first gas openings 186A-186C, the one or more second gas openings 186D, and the one or more third gas openings 186E is aligned with a respective flow zone 454 of the plurality of flow zones 454A-454E.

The present disclosure contemplates that the sections 401-404 of the flow guide structure 150 can be coupled to each other (e.g., integrally formed for example as a ring structure) or can be decoupled from each other for independent movement.

Simultaneously with the one or more gas sources 196 supplying the one or more process gases P1 through the injection section 401, one or more gas sources 496, 498 can supply the one or more process gases P1 to the processing volume 124 through the first and second cross-flow sections 403, 404. The third flow dividers 451 of the sections 401-404 substantially isolate (e.g., seal) the flow gaps 456 from the one or more process gases P1. The third flow dividers 451 facilitate reduced interference of the process gases P1 with the heating (e.g., light) of the side heat sources 118a-118d.

Figure 5:
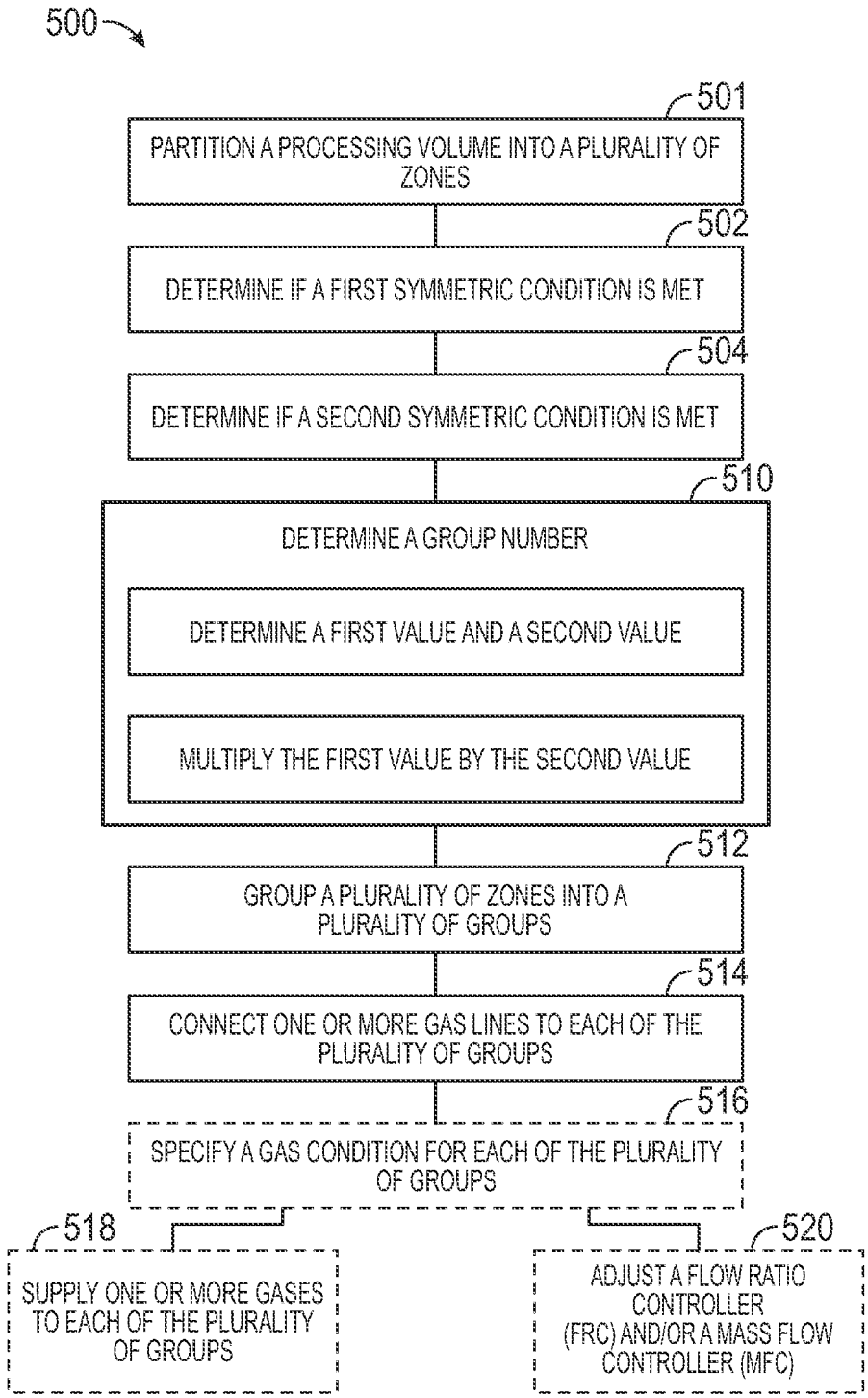
FIG. 5 is a schematic diagram view of a method of correlating zones of a processing chamber, according to one implementation.

FIG. 5 is a schematic diagram view of a method 500 of correlating zones of a processing chamber having a processing volume, according to one implementation.

Operation 501 of the method 500 includes partitioning the processing volume into a plurality of zones along a first direction of the processing volume and a second direction of the processing volume. The partitioning can be physical in nature (e.g., using barriers such as flow dividers) or visual in nature (e.g., using reference lines without using barriers, for visual reference purposes). The second direction intersects the first direction. In one or more embodiments, the second direction is perpendicular to the first direction. The plurality of zones have a first zone number (m), and a second zone number (n). In one or more embodiments, the first zone number (m) and the second zone number (n) can each be defined by the number of barrier (e.g., flow dividers) that divide the processing volume for flow purposes.

Each of the first zone number (m) and the second zone number (n) can be equal to or greater than the total number of asymmetries that are identified along each of the first direction and the second direction, respectively. An asymmetry can be an asymmetry with respect to a physical condition, such as a non-uniform spacing between substrates and/or a non-uniform placement of barrier(s) existing between the substrates along the respective first or second direction. The present disclosure contemplates that other asymmetries may exist. As an example, an asymmetry can be an asymmetry in another physical condition, such as geometric design (e.g., distance to a reference plane, shape, and/or dimensions), local volumetric (zone) size, gas composition, gas residence time within the local volume, time needed to heat to a temperature, energy needed to heat to a temperature, energy needed to transport gases to and from the local volume, chamber materials, substrate surface materials, and/or substrate surface temperatures and/or processing duration within and adjacent to the local volume. In one or more embodiments, an asymmetry is identified if the asymmetry is present at all times before, during, and after processing (e.g., deposition). In one or more embodiments, an asymmetry is identified if a difference in value for a physical condition between any two zones is higher than 5%, such as 10% or higher.

Operation 502 of the method 500 includes determining if a first symmetric condition is met along a first direction of the processing chamber. In one or more embodiments, the first symmetric condition is not met if at least one asymmetry is identified between any two zones along the first direction in the processing volume. The present disclosure contemplates that the any two zones may or may not align with each other in the first direction. In one or more embodiments, the first symmetric condition is met if no asymmetry is identified along the first direction in the processing volume.

As discussed herein, an asymmetry can exist with respect to a variety of conditions, such as one or more physical conditions. The present disclosure contemplates that a plurality of zones can be geometrically symmetric (e.g., mirror images of each other with respect to a reference plane), and an asymmetry can still exist with respect to one or more other physical conditions (e.g., gas residence times within the local volumes of the zones) for the plurality of zones.

The determining of operation 502 can include determining if a first plane symmetry is met along the first direction 601 (see FIG. 6) such that the zones are geometrically symmetric (e.g., in a mirror image fashion) relative to a first central plane 603 (see FIG. 6) that is perpendicular to the first direction 601.

Operation 504 includes determining if a second symmetric condition is met along a second direction of the processing chamber. In one or more embodiments, the second symmetric condition is not met if at least one asymmetry is identified between any two zones along the first direction in the processing volume. The present disclosure contemplates that the any two zones may or may not align with each other in the second direction. In one or more embodiments, the second symmetric condition is met if no asymmetry is identified along the second direction in the processing volume.

The determining of operation 504 can include determining if a first plane symmetry is met along the second direction 602 (see FIG. 6) such that the zones are geometrically symmetric (e.g., in a mirror image fashion) relative to a second central plane 604 (see FIG. 6) that is perpendicular to the second direction 602.

If the first plane symmetry and the second plane symmetry are both determined to be met, then a two-fold plane symmetry is met in each of the first direction and the second direction.

Operation 510 includes determining a group number. The determining of the group number includes determining a first value and a second value, and multiplying the first value by the second value. The first value correlates to a first zone number (m) of a plurality of zones and the second value correlates to a second zone number (n) of the plurality of zones. In one or more embodiments, the determined group number is lesser than a reference number that is equal to the first zone number (m) multiplied by the second zone number (n).

Optionally, if both the first plane symmetry and the second plane symmetry are met, then the determining of the first value includes dividing the first zone number (m) by 2.0 for a first result, and rounding up to the nearest integer if the first result is not a whole number. If the first result is a whole number, then the first result need not be rounded up and the first value is equal to the first result. If both the first plane symmetry and the second plane symmetry are met, then the determining of the second value includes dividing the second zone number (n) by 2.0 for a second result, and rounding up to the nearest integer if the second result is not a whole number. If the second result is a whole number, then the second result need not be rounded up and the second value is equal to the second result. As described above, the determining of the group number—if both the first plane symmetry and the second plane symmetry are met—can be represented by the following Equation 1:

$$\text{Group Number} = (\text{Roundup}(m/2)) * (\text{Roundup}(n/2)) \quad \text{(Equation 1)}$$

Optionally, if the second plane symmetry is met and the first plane symmetry is not met, then the first value is equal to the first zone number (m). If the second plane symmetry is met and the first plane symmetry is not met, then the determining of the second value includes dividing the second zone number (n) by 2.0 for a result; and rounding up to the nearest integer if the result is not a whole number. If the result is a whole number, then the result need not be rounded up and the second value is equal to the result. As described above, the determining of the group number—if the second plane symmetry is met and the first plane symmetry is not met—can be represented by the following Equation 2:

$$\text{Group Number} = (m) * (\text{Roundup}(n/2)) \quad \text{(Equation 2)}$$

Optionally, if the first plane symmetry is met and the second plane symmetry is not met, then the second value is equal to the second zone number (n). If the first plane symmetry is met and the second plane symmetry is not met, then the determining of the first value includes dividing the first zone number (m) by 2.0 for a result, and rounding up to the nearest integer if the result is not a whole number. If the result is a whole number, then the result need not be rounded up and the first value is equal to the result. As described above, the determining of the group number—if the first plane symmetry is met and the second plane symmetry is not met—can be represented by the following Equation 3:

$$\text{Group Number} = (\text{Roundup}(m/2)) * (n) \quad \text{(Equation 3)}$$

Operation 512 includes grouping the plurality of zones into a plurality of groups. The plurality of groups have a number that is equal to the group number. The plurality of zones can be represented in the following matrix, where each respective zone ($N_{i,j}$) has a first position (i) along the first direction and a second position (j) along the second direction:

$$\begin{Bmatrix} N_{1,1} & N_{1,2} & \ldots & N_{1,n} \\ N_{2,1} & N_{2,2} & \ldots & N_{2,n} \\ \vdots & \vdots & & \vdots \\ N_{m,1} & N_{m,2} & \ldots & N_{m,n} \end{Bmatrix}$$

In one or more embodiments, the grouping (of operation 512) of the plurality of zones includes, for each respective zone: conducting a first grouping operation that groups the respective zone along the first direction 601 (see FIG. 6) with each other zone that is symmetric (e.g., with respective to the physical condition(s)) with the respective zone. In such an embodiment, for each respective zone, the respective zone is not grouped with one or more zones along the first direction 601 that are not symmetric (e.g., with respective to the physical condition(s)) with the respective zone. In one or more embodiments, if the first symmetric condition (of operation 502) is met, then the grouping (of operation 512) of the plurality of zones includes, for each respective zone, grouping the respective zone with each other zone having the same second position (j).

In one or more embodiments, the grouping of the plurality of zones includes, for each respective zone: conducting a second grouping operation that groups the respective zone along the second direction 602 (see FIG. 6) with each other zone that is symmetric (e.g., with respective to the physical condition(s)) with the respective zone. In such an embodiment, for each respective zone, the respective zone is not grouped with one or more zones along the second direction 602 that are not symmetric (e.g., with respective to the physical condition(s)) with the respective zone. In one or more embodiments, if the second symmetric condition (of operation 504) is met, then the grouping (of operation 512) of the plurality of zones includes, for each respective zone, grouping the respective zone with each other zone having the same first position (i).

Optionally, in one or more embodiments, if the first plane symmetry is met, then the grouping (of operation 512) of the plurality of zones includes, for each respective zone having the first position (i) along the first direction and the second position (j) along the second direction: conducting a first grouping operation that groups the respective zone along the first direction with each other zone that has the same second position (j) along the second direction and a first reference position along the first direction. The first reference position is equal to: the first position (i) subtracted from the first zone number (m), with the addition of 1. The first position (i) is iterated from 1 through and up to the first zone number (m) and the second position (j) is iterated from 1 through and up to the second zone number (n). As described above, the grouping of the first grouping operation can be represented by the following Equation 4:

$$N_{i,j} = N_{m-i+1,j} \quad \text{(Equation 4)}$$

Optionally, in one or more embodiments, if the second plane symmetry is met, then the grouping (of operation 512) of the plurality of zones includes, for each respective zone having the first position (i) along the first direction and the second position (j) along the second direction: conducting a second grouping operation that groups the respective zone along the second direction with each other zone that has the same first position (i) along the first direction and a second reference position along the second direction. The second reference position is equal to: the second position (j) subtracted from the second zone number (n), with the addition of 1. The first position (i) is iterated from 1 through and up to the first zone number (m) and the second position (j) is iterated from 1 through and up to the second zone number (n). As described above, the grouping of the second grouping operation can be represented by the following Equation 5:

$$N_{i,j} = N_{i,n-j+1} \quad \text{(Equation 5)}$$

Operation 514 includes connecting one or more gas lines to each respective group of the plurality of groups such that the same one or more gas lines connect a subset of the plurality of zones grouped into the respective group.

Optional operation 516 includes specifying a gas condition for each respective group of the plurality of groups. In one or more embodiments, the gas condition includes one or more of a composition ratio, a partial pressure, and/or a flow rate. The composition ratio can include atomic percentage concentration(s) of one or more elements in the composition. The flow rate can be a velocity. The flow rate can be, for example, a volumetric flow rate or a mass flow rate. In one or more embodiments, the heating condition includes a heating power applied to the heat sources that are directed to heat the respective group of zones.

Optional operation 518 includes supplying one or more gases to each respective group of the plurality of groups such that the one or more gases are supplied at the same gas condition to a subset of the plurality of zones grouped into the respective group. In one or more embodiments, the same gas condition includes one or more of the same gas condition includes one or more of gas composition, pressure, and/or flow rate.

Optional operation 520 includes adjusting one or more of a flow ratio controller (FRC) and/or a mass flow controller (MFC) associated with a group of the plurality of groups.

The present disclosure contemplates that one or more of (such as all) of the operations 502-522 of the method 500 can be repeated. In one or more embodiments, the method 500 is conducted for the injection section 401 of the processing apparatus 100 to group a first plurality of zones, and the method 500 is repeated for the first cross-flow section 403 of the processing apparatus 100 to group a second plurality of zones, and/or the method 500 is repeated for the second cross-flow section 404 of the processing apparatus to group a third plurality of zones. In one or more embodiments, the first zone number (m) is equal to the number of levels flow levels 153 and the number of inject levels for each respective section 401, 403, 404. In one or more embodiments, the second zone number (n) is equal to the number of flow zones 454 for each respective section 401, 403, 404. For example, the first zone number (m) and the second zone number (n) can be defined by the number of first flow dividers 151 and the number of third flow dividers 451. The present disclosure contemplates that the first zone number (m) can be different than the number of levels flow levels 153 and the number of inject levels for each respective section 401, 403, 404, and/or the second zone number (n) can be different than the number of flow zones 454 for each respective section 401, 403, 404.

The method 500 facilitates simplifying gas delivery hardware, enhanced cost effectiveness, and enhanced process control (such as process uniformity and/or independent gas control).

The present disclosure contemplates a variety of sequences for the method 500. As an example, operation 512 can be conducted after operation 510 or prior to operation 510.

Figure 6:
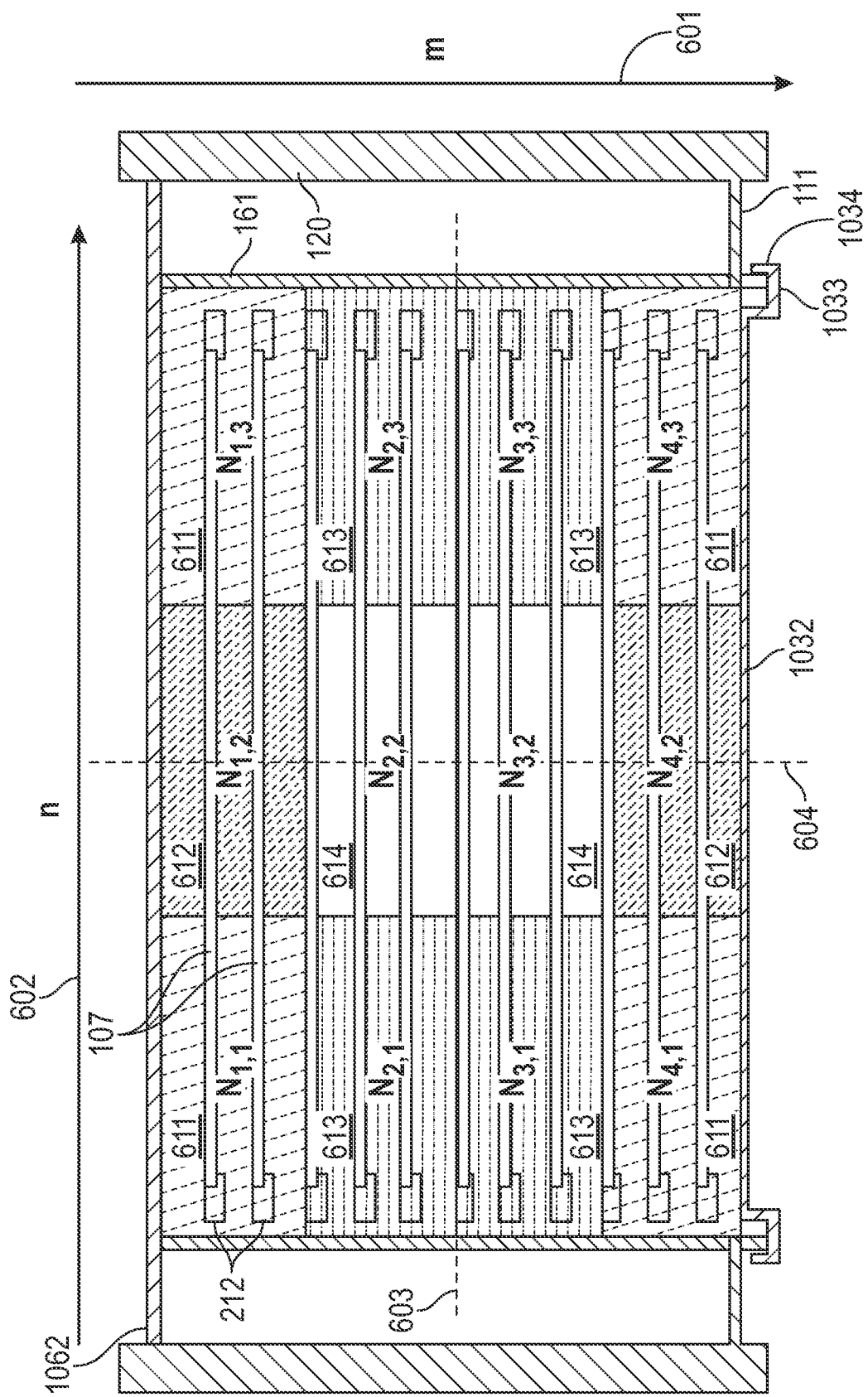
FIG. 6 is a schematic partial side view of the injection section of the processing apparatus shown in FIGS. 1-4, according to one implementation.

FIG. 6 is a schematic partial side view of the injection section 401 of the processing apparatus 100 shown in FIGS. 1-4, according to one implementation. In the exemplary implementation shown in FIG. 6, the injection section 401 is divided into twelve zones (N). The first zone number (m) along a first direction 601 is 4, and the second zone number (n) along a second direction 602 is 3. The first symmetric condition and the second symmetric condition (of operations 502 and 504) are both met. The first zone number (m) of 4 is divided by 2 to determine a first result of 2. Since the first result need not be rounded up, a first value (of operation 510) is 2. The second zone number (n) of 3 is divided by 2 to determine a second result of 1.5. Since the second result is not a whole number, the second result is rounded up to determine a second value (of operation 510) of 2. By multiplying 2 (the first value) by 2 (the second value), a group number (of operation 510) is determined to be 4. Hence, the twelve zones (N) of FIG. 6 are grouped into four groups 611, 612, 613, 614.

The twelve zones are grouped respectively together in four total groups according to operation 512. As an example, a first group 611 of the four groups includes a first zone $(N_{1,1})$, a second zone $(N_{1,3})$, a third zone $(N_{4,1})$, and a fourth zone $(N_{4,3})$.

Figure 7:
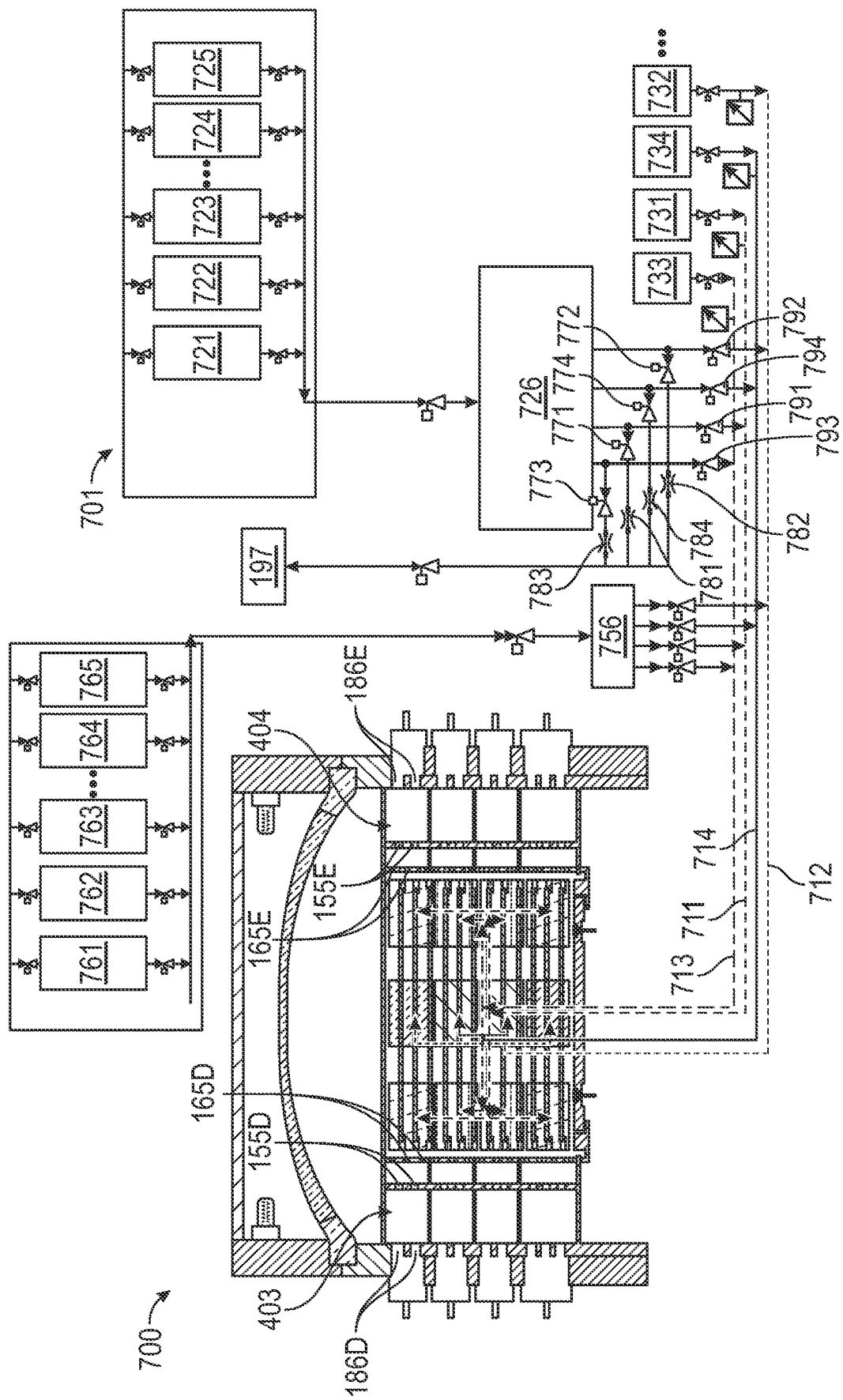
FIG. 7 is a schematic partial side view of a system for processing substrates, according to one implementation.

FIG. 7 is a schematic partial side view of a system 700 for processing substrates, according to one implementation. The system 700 includes the processing apparatus 100. The system 700 includes a first gas circuit 701 configured to supply gas(es) to the twelve zones (N) of the injection section 401 of the processing chamber.

The system 700 includes a first main line 711 fluidly connected to a first subset of the gas channels 185A-185C and the plurality of gas openings 186A-186C. The first subset is aligned (e.g., radially aligned) with a first group 611 of the plurality of zones (N).

The system 700 includes a second main line 712 fluidly connected to a second subset of the gas channels 185A-185C and the plurality of gas openings 186A-186C. The second subset is aligned (e.g., radially aligned) with a second group 612 of the plurality of zones (N).

The system 700 includes a third main line 713 fluidly connected to a third subset of the gas channels 185A-185C and the plurality of gas openings 186A-186C. The third subset is aligned (e.g., radially aligned) with a third group 613 of the plurality of zones (N).

The system 700 includes a fourth main line 714 fluidly connected to a fourth subset of the gas channels 185A-185C and the plurality of gas openings 186A-186C. The fourth subset is aligned (e.g., radially aligned) with a fourth group 614 of the plurality of zones (N).

The first gas circuit 701 includes one or more flow ratio controllers (FRCs) 726 configured to supply one or more reactive gases to each of the main lines 711-714. One or more reactive gas sources 721-724 supply the one or more reactive gases to the FRC 726. A carrier gas source 725 is configured to supply a carrier gas (e.g., an inert gas or a gas such as $H_2$) to the FRC 726. The carrier gas and the one or more reactive gases mix into a mixture, and the FRC 726 splits the mixture across the main lines 711-714.

The first gas circuit 701 includes a respective mass flow controller (MFC) 731-734 for each main line 711-714. Each MFC 731-734 is configured to supply a respective carrier gas to the respective main line 711-714. The MFCs 731-734 can supply the same carrier gas (e.g., hydrogen ($H_2$)) to each of the main lines 711-714. For each main line 711-714, the carrier gas supplied from the respective MFC 731-734 mixes with the mixture from the FRC 726 to form an injection composition. The injection composition is delivered through the respective main line 711-714 to the respective group 611-614 of zones (N) that corresponds to the respective main line 711-714.

As discussed above, the controller 1070 can be configured to conduct one or more operations of the method 500. The controller 1070 can control operations of the gas circuit 701 (such as the FRC 726 and the MFCs 731-734). Using the controller 1070, a gas condition can be specified for each of the main lines 711-714 (and the corresponding groups 611-614) such that four gas conditions are specified. The four main lines 711-714 can simultaneously and independently supply the one or more reactive gases (from the FRC 726), the carrier gas (from the FRC 726), and the carrier gas(es) (from the MFCs 731-734) to the gas channels 185A-185C and the gas openings 186A-186C aligning with the zones. The gases are simultaneously supplied to the subsets of gas channels 185A-185C and gas openings 186A-186C at the specified gas conditions. Using the FRC 726 and/or the MFCs 731-734, the flow of gases supplied to each group 611-614 of zones can be independently controlled to facilitate more uniform gas flow and more uniform deposition across the batch processing of the substrates 107. As an example, the FRC 726 and/or the MFCs 731-734 can be adjusted to meet each of the gas conditions for each of the groups 611-614 of zones. As an example, the mixture supplied to the first main line 711 from the FRC 726 and/or the carrier gas supplied from the first MFC 731 can be adjusted to meet a composition ratio (for the injection composition) specified by the first gas condition for the first group 611 of zones (N).

The first gas circuit 701 includes one or more supplemental (FRCs) 756 configured to supply one or more supplemental reactive gases to each of the main lines 711-714. One or more supplemental reactive gas sources 761-764 supply the one or more reactive gases to the supplemental FRC 756. A carrier gas source 765 is configured to supply a supplemental carrier gas (e.g., an inert gas or a gas such as $H_2$) to the supplemental FRC 756. The gas(es) supplied from the supplemental FRC 756 and to one or more of the main lines 711-714 can be simultaneously supplied with the injection composition to meet each of the gas conditions for each of the groups 611-614 of zones.

In one or more embodiments, the plurality of operations conducted using the controller 1070 include a pressure alignment operation. The pressure alignment operation includes venting a first precursor gas flow through a first vent valve 771 and a first back pressure control (BPC) device 781 while a first supply valve 791 is closed. The first supply valve 791 is fluidly connected to the first main line 711.

The pressure alignment operation includes venting a second precursor gas flow through a second vent valve 772 and a second back pressure control (BPC) device 782 while a second supply valve 792 is closed. The second supply valve 792 is fluidly connected to the second main line 712. The first and second precursor gas flows each include the one or more reactive gases supplied from the one or more reactive gas sources 721-724.

The pressure alignment operation includes opening the first supply valve 791, opening the second supply valve 792, closing the first vent valve 771 after opening the first supply valve 791, and closing the second vent valve 772 after opening the second supply valve 792. The first gas circuit 701 includes a third vent valve 773 and a fourth vent valve 774 that function in a manner similar to the first and second vent valves 771, 772, third BPC device 783 and a fourth BPC device 784 that function in a manner similar to the first and second BPC devices 781, 782. Venting the precursor flows to the one or more pump devices 197 prior to opening the supply valves facilitates reducing or eliminating pressure fluctuations in the main lines 711-714 when the precursor flows mix with the carrier gases in the main lines 711-714.

The present disclosure contemplates that although four main lines 711-714 are shown in FIG. 7 as fluidly connected to four respective subsets of gas openings 186, and the respective subsets are aligned respectively with four respective groups 611-614 of the plurality of zones (N). The present disclosure contemplates a variety of numbers of main lines, subsets of gas openings, and groups of zones (N). As an example, the system 700 can include six (or more) main lines fluidly connected to six (or more) respective subsets of gas openings 186, and the respective subsets are aligned respectively with six (or more) respective groups of the plurality of zones (N). A different number of groups (such as two or five) can be used for correlating the zones (N).

As shown in FIG. 7, one or more main lines, one or more FRCs, one or more MFCs, one or more valves, and/or one or more BPCs can be associated with each respective group 611-614 of zones (N) that are correlated together and controlled such that the same gas condition is used for each of the correlated zones (N) in each respective group 611-614.

Figure 8:
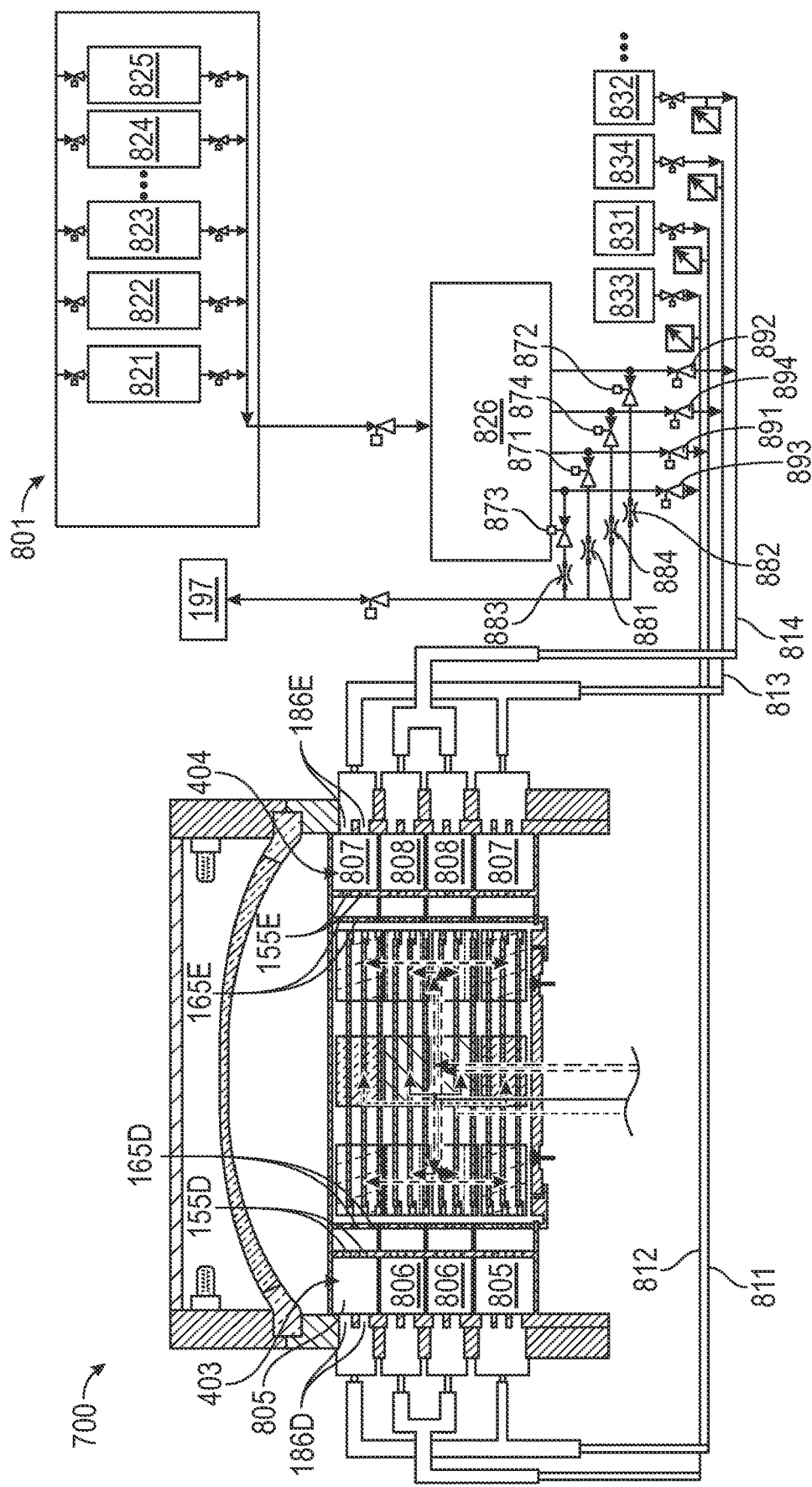
FIG. 8 is a schematic partial side view of the system for processing substrates, according to one implementation.

FIG. 8 is a schematic partial side view of the system 700 for processing substrates, according to one implementation. The system 700 includes the processing apparatus 100. The system 700 includes a second gas circuit 801 configured to supply gas(es) to the four first side zones (N) of the first cross-flow section 403 of the processing chamber, and the four second side zones (N) of the second cross-flow section 404 of the processing chamber. The twelve zones (N) of the injection section 401 are injection zones.

The gas openings 186D, 186E are side gas openings that (as shown in FIG. 4) are offset from the plurality of gas openings 186A-186C of the injection section 401 by at least 20 degrees, for example 45 degrees or higher, such as 90 degrees or higher. FIG. 4 shows the side gas openings 186D, 186E offset from the plurality of gas openings 186A-186C of the injection section 401 by an angle A3.

The system 700 includes a first side main line 811 fluidly connected to a first side subset of the side gas openings 186D, 186E. The first side subset is aligned (e.g., radially aligned) with a first side group 805 of the side zones (N).

The system 700 includes a second side main line 812 fluidly connected to a second side subset of the side gas openings 186D, 186E. The second side subset is aligned (e.g., radially aligned) with a second side group 806 of the side zones (N).

The system 700 includes a third side main line 813 fluidly connected to a third side subset of the side gas openings 186D, 186E. The third side subset is aligned (e.g., radially aligned) with a third side group 807 of the side zones (N).

The system 700 includes a fourth side main line 814 fluidly connected to a fourth side subset of the side gas openings 186D, 186E. The fourth side subset is aligned (e.g., radially aligned) with a fourth side group 808 of the side zones (N).

The second gas circuit 801 includes one or more side FRCs 826 configured to supply one or more side reactive gases to each of the side main lines 811-814. One or more side reactive gas sources 821-824 supply the one or more side reactive gases to the side FRC 826. A side carrier gas source 825 is configured to supply a side carrier gas (e.g., an inert gas or a gas such as $H_2$) to the side FRC 826. The side carrier gas and the one or more side reactive gases mix into a side mixture, and the side FRC 826 splits the side mixture across the side main lines 811-814.

The second gas circuit 801 includes a respective side MFC 831-834 for each side main line 811-814. Each side MFC 831-834 is configured to supply a respective side carrier gas to the respective side main line 811-814. The side MFCs 831-834 can supply the same side carrier gas (e.g., hydrogen ($H_2$)) to each of the side main lines 811-814. For each side main line 811-814, the side carrier gas supplied from the respective side MFC 831-834 mixes with the side mixture from the side FRC 826 to form a side injection composition. The side injection composition is delivered through the respective side main line 811-814 to the respective side group 805-808 of side zones (N) that corresponds to the respective side main line 811-814.

The controller 1070 can control operations of the second gas circuit 801 (such as the side FRC 826 and the side MFCs 831-834). Using the controller 1070, a gas condition can be specified for each of the side main lines 811-814 (and the corresponding groups 805-808) such that four gas conditions are specified. The four side main lines 811-814 can simultaneously and independently supply the one or more side reactive gases (from the FRC 826), the side carrier gas (from the FRC 826), and the side carrier gas(es) (from the side MFCs 831-834) to the side gas openings 186D, 186E aligning with the zones. The gases are simultaneously supplied to the subsets of side gas openings 186D, 186E at the specified gas conditions. Using the side FRC 826 and/or the side MFCs 831-834, the flow of gases supplied to each side group 805-808 can be independently controlled to facilitate more uniform gas flow and more uniform deposition across the batch processing of the substrates 107. As an example, the side FRC 826 and/or the side MFCs 831-834 can be adjusted to meet each of the gas conditions for each of the groups 805-808 of zones. As an example, the side mixture supplied to the first side main line 811 from the side FRC 826 and/or the side carrier gas supplied from the first side MFC 831 can be adjusted to meet a composition ratio (for the side injection composition) specified by the first gas condition for the first side group 805 of side zones (N).

The second gas circuit 801 can include one or more side supplemental FRCs (e.g., similar to 756) and one or more side supplemental reactive gas sources (e.g., similar to 761-764) used in relation to the side main lines 811-814.

The second gas circuit 801 includes vent valves 871-874, BPC devices 881-884, and supply valves 891-894 that are configured to conduct the pressure alignment operation described above in relation to the second gas circuit 801.

Benefits of the present disclosure include uniform gas flow and adjustability, uniform temperatures and adjustability, independent control of zones (e.g., concentrations of composition ratios of gases), reduced or eliminated pressure fluctuations in supply lines, increased throughput, efficient use of gases, reduced costs, reduced processing times, increased chamber capacity, increased growth rates of deposited films, enhanced device performance, more continuous gas velocities of gases flowing over substrates, more uniform device performance across a plurality of substrates, more uniform and stable thermal processing across a plurality of substrates, and reduced dimensions and footprint (e.g., of chambers). Benefits also include uniform adjustability, such as processing temperature control and adjustability, gas parameter control and adjustability, and substrate center-to-edge (e.g., deposition uniformity) control and adjustability. As an example, such benefits are facilitated in relatively complex operations, such as operations that call for increased center-to-edge deposition uniformity and/or batch processing a plurality of substrates at the same time.

Benefits also include enhanced device performance and modularity in application. As an example, batch processing can be used for relatively complex epitaxial deposition operations at relatively smaller footprints, relatively larger throughputs, while maintaining or enhancing growth rates and maintaining or enhancing device performance. Such benefits of the present application are facilitated by implementations of the present disclosure. Such benefits can be facilitated, for example, for inner substrates that are not the outermost substrates of a plurality of substrates supported on a cassette.

It is contemplated that aspects described herein can be combined. For example, one or more features, aspects, components, operations, and/or properties of the processing apparatus 100, the method 500, the system 700, the first gas circuit 701, and/or the second gas circuit 702 can be combined. It is further contemplated that any combination(s) can achieve the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A method of correlating zones of a processing chamber having a processing volume, comprising:
    partitioning the processing volume into a plurality of zones along a first direction of the processing volume and a second direction of the processing volume, the second direction intersecting the first direction, the plurality of zones having:
        a first zone number (m), and
        a second zone number (n);
    determining a group number, the determining of the group number comprising:
        determining a first value and a second value, the first value correlating to the first zone number (m) of the plurality of zones and the second value correlating to the second zone number (n) of the plurality of zones
        multiplying the first value by the second value;
    grouping the plurality of zones into a plurality of groups, the plurality of groups having a number that is equal to the group number; and
    connecting one or more gas lines to each respective group of the plurality of groups such that the same one or more gas lines fluidly connect to a subset of the plurality of zones grouped into the respective group.

2. The method of claim 1, wherein the grouping of the plurality of zones comprises, for each respective zone:
conducting a first grouping operation that groups the respective zone along the first direction with each other zone that is symmetric with respect to one or more physical conditions.

3. The method of claim 2, wherein the grouping of the plurality of zones comprises, for each respective zone:
conducting a second grouping operation that groups the respective zone along the second direction with each other zone that is symmetric with respect to one or more physical conditions.

4. The method of claim 1, further comprising, prior to the determining of the group number:
determining if a first symmetric condition is met for the processing volume along the first direction, the determining comprising:
determining if a first plane symmetry is met along the first direction; and
determining if a second symmetric condition is met for the processing volume along the second direction, the determining comprising:
determining if a second plane symmetry is met along the first direction.

5. The method of claim 4, wherein the second direction is perpendicular to the first direction.

6. The method of claim 4, wherein if both the first plane symmetry and the second plane symmetry are met, then:
the determining of the first value comprises:
dividing the first zone number (m) by 2.0 for a first result, and
rounding up to the nearest integer if the first result is not a whole number; and
the determining of the second value comprises:
dividing the second zone number (n) by 2.0 for a second result, and
rounding up to the nearest integer if the second result is not a whole number.

7. The method of claim 4, wherein if the second plane symmetry is met and the first plane symmetry is not met, then the first value is equal to the first zone number (m), and the determining of the second value comprises:
dividing the second zone number (n) by 2.0 for a result; and
rounding up to the nearest integer if the result is not a whole number.

8. The method of claim 4, wherein if the first plane symmetry is met and the second plane symmetry is not met, then the second value is equal to the second zone number (n), and the determining of the first value comprises:
dividing the first zone number (m) by 2.0 for a result; and
rounding up to the nearest integer if the result is not a whole number.

9. The method of claim 1, further comprising:
supplying one or more gases to each respective group of the plurality of groups such that the one or more gases are supplied at the same gas condition to a subset of the plurality of zones grouped into the respective group, wherein the same gas condition includes one or more of gas composition, pressure, or flow rate.

10. The method of claim 4, wherein if the first plane symmetry is met, then the grouping of the plurality of zones further comprises, for each respective zone having a first position (i) along the first direction and a second position (j) along the second direction:
conducting a first grouping operation that groups the respective zone along the first direction with each other zone that has the same second position (j) along the second direction and a first reference position along the first direction that is equal to: the first position (i) subtracted from the first zone number (m), with the addition of 1.

11. The method of claim 10, wherein if the second plane symmetry is met, then the grouping of the plurality of zones comprises, for each respective zone having the first position (i) along the first direction and the second position (j) along the second direction:
conducting a second grouping operation that groups the respective zone along the second direction with each other zone that has the same first position (i) along the first direction and a second reference position along the second direction that is equal to: the second position (j) subtracted from the second zone number (n), with the addition of 1.

12. The method of claim 1, wherein the method is conducted for an injection section of the processing chamber, and the method is repeated for a cross-flow section of the processing chamber.

13. The method of claim 1, further comprising adjusting one or more of a flow ratio controller (FRC) or a mass flow controller (MFC) associated with a group of the plurality of groups.

* * * * *